SEMI-CONDUCTOR GATING CIRCUIT

Filed Sept. 4, 1956

INVENTOR.
Theodore P. Bothwell
& Walter A. Helbig
BY Morris Rabkin
ATTORNEY

United States Patent Office 2,979,625

Patented Apr. 11, 1961

2,979,625

SEMI-CONDUCTOR GATING CIRCUIT

Theodore P. Bothwell, Delaware Township, Camden County, and Walter A. Helbig, Westville, N.J., assignors to Radio Corporation of America, a corporation of Delaware Filed Sept. 4, 1956, Ser. No. 607,866

13 Claims. (Cl. 307—88.5)

Figure 1:
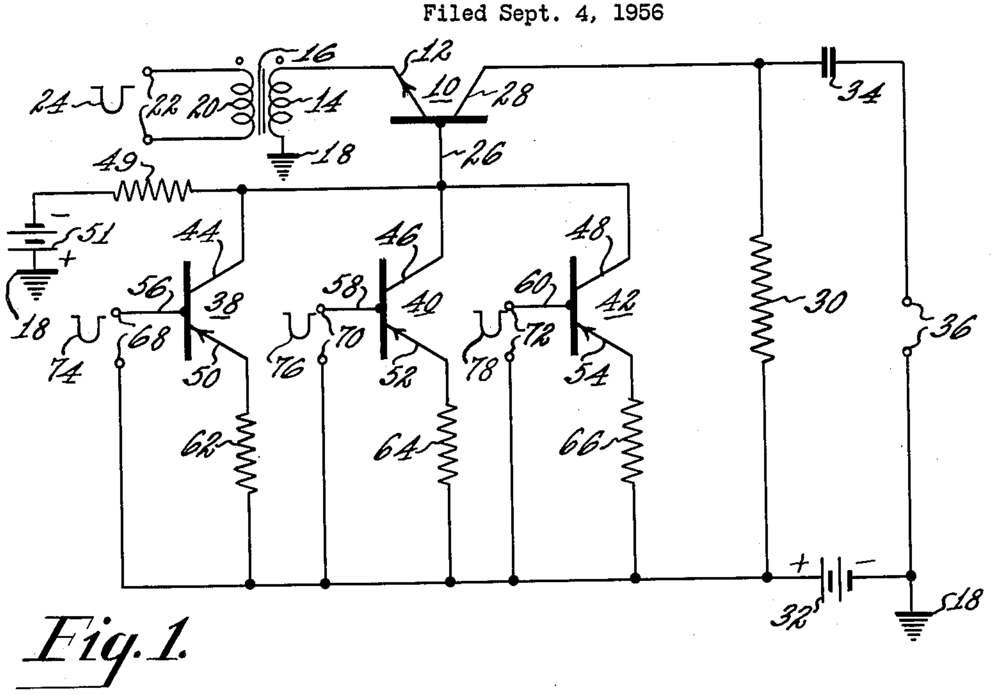

This invention relates to semi-conductor gating circuits.

Gating circuits, usually referred to as "and" gates, may be either of the transmission type or of the switching type. Switching type gates merely pass or switch a signal of predetermined amplitude and waveform to a load in response to a prescribed set of conditions such as a coincidence or non-coincidence of applied control signals. Transmission gates, on the other hand, pass a more or less accurate replica of the input signal to the load in response to the prescribed set of conditions. Inhibitory gates provide an output signal (or transmit a signal to an output) in the absence of one or more gating inputs. Transistors have been utilized to advantage in gating circuits. However, transistor gating circuits often have the disadvantage of a limited number of possible inputs due to the normal transistor leakage current. Also, many transistor gating circuits have somewhat slower switching speeds than desired due to the hole storage effect of a saturated transistor.

An object of this invention is to provide an improved semi-conductor gating circuit, which gating circuit allows a relatively large number of inputs.

Another object of the present invention is to provide an improved transistor gating circuit which may be changed from a coincidence gate to an inhibitory gate by changing the type of one transistor.

A further object of this invention is to provide an improved transistor gating circuit in which circuit operation is relatively independent of variations in the characteristics of a given type of transistor.

Still another object of this invention is to provide an improved transistor gating circuit capable of operating at a high rate of speed.

In accordance with this invention, a gating circuit has a gating transistor and a plurality of auxiliary transistors. The gating transistor, coupled as a common base amplifier, is gated by a voltage proportional to the sum of the collector currents of the several auxiliary transistors flowing through a common resistor. The voltage change due to collector current flow in the summing resistor forward biases the base-emitter diode of the gating transistor. A resistor coupled to the emitter of each of the auxiliary transistors may insure relatively constant current regardless of the individual characteristics of the given type of the auxiliary transistors. These emitter resistors allow faster gating repetition frequencies by preventing saturation in the auxiliary transistors. Inputs to the auxiliary transistor bases may initiate the gating action. If an input signal is applied at the emitter of the gating transistor, a transmission type gate results and this input signal is transmitted through the gating transistor. If, however, no signal is applied to the emitter of the gating transistor, a switching gate results.

If the gating transistor is of the opposite type conductivity as the several auxiliary transistors, the circuit is the usual "and" gate type. If, on the other hand, the gating transistor is of the same conductivity type as that of the auxiliary transistors, the circuit is an inhibitory gate. In the latter case, a signal at the emitter of the gating transistor is passed in the absence of a signal at any one or more of the auxiliary transistor bases. No output signal results from the inhibitory gate unless an input signal is applied to the emitter.

Figure 2:
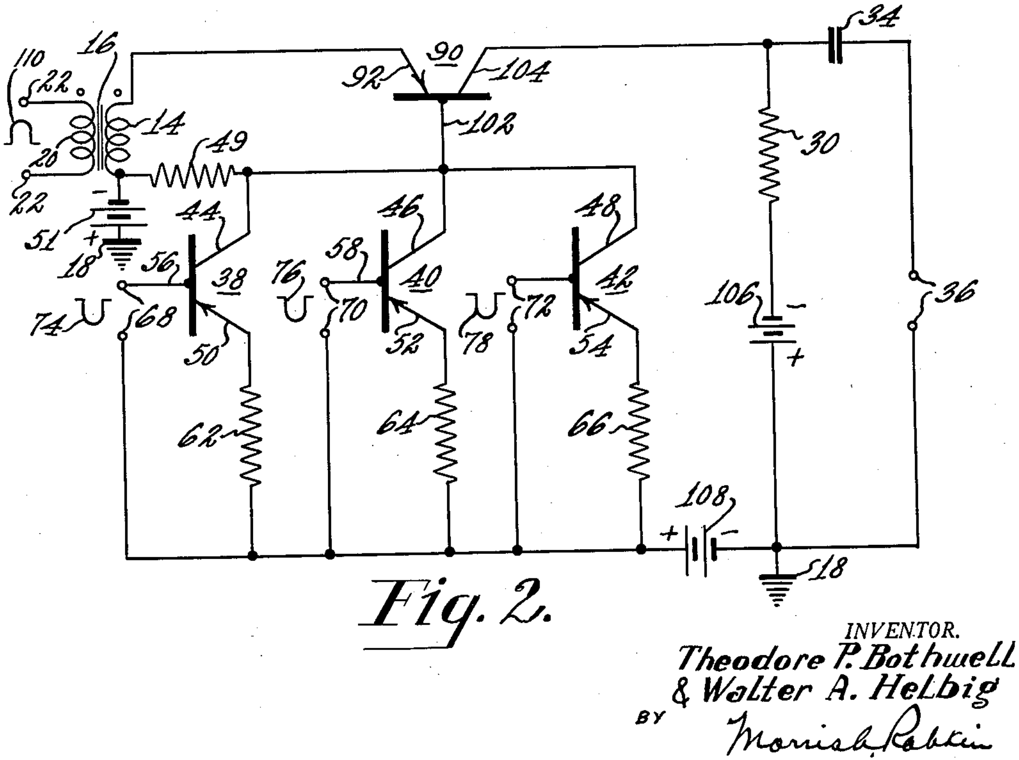

The novel features of this invention as well as the invention itself, both as to its organization and method of operation, will best be understood from the following description, when read in connection with the accompanying drawing, in which like reference numerals refer to like parts, in which:

Figure 1 is a circuit diagram of one embodiment of this invention, illustrating a coincidence gate circuit; and, Figure 2 is a circuit diagram of another embodiment in accordance with this invention illustrating an inhibitory gate circuit.

In Figure 1, a first transistor 10 of the N-P-N type has an emitter electrode 12 connected through the secondary 14 of a transformer 16 to a point of reference potential, indicated as ground 18 for the circuit by the conventional ground symbol. The transformer 16 also has a primary winding 20 to which are connected a pair of input terminals 22. The transformer 16 has winding polarities, as indicated by the dots employed in their conventional sense. Thus, a negative-going signal 24, that is, negative-going at the dot-marked terminal 22 with respect to the unmarked terminal 22, is applied as a negative-going signal to the emitter 12.

The first transistor 10 may be termed a switching or gating transistor and has also a base electrode 26 and a collector electrode 28. The collector 28 is coupled through an output load resistor 30 to the positive terminal of a first current source which is illustrated, for example, as being a battery 32. The negative terminal of the first current source is returned to ground 18. The collector 28 of the gating transistor 10 is also coupled through a capacitor 34 to one of a pair of output terminals 36. The other of the pair of output terminals 36 is coupled to the ground 18.

First, second, and third auxiliary transistors 38, 40 and 42, respectively, of a conductivity type opposite to that of the gating transistor 10 each have collector electrodes 44, 46 and 48, respectively, coupled to the gating transistor base 26 and through a summing resistor 49 to the negative terminal of a second direct current source, which may, for example, be a battery 51. The positive terminal of the battery 51 is returned to ground. These auxiliary transistors 38, 40 and 42, have, respectively, emitter electrodes 50, 52 and 54, and, respectively, base electrodes 56, 58 and 60. The emitters 50, 52 and 54 are coupled through current limiting resistors 62, 64 and 66, respectively, to the positive terminal of the battery 32. The bases 56, 58 and 60, respectively, are coupled to one of a pair of input terminals 68, 70 and 72, respectively. The other of each of the pairs of input terminals 68, 70 and 72, respectively, is coupled to the positive terminal of the battery 32.

For "normal" amplifying action in a transistor, the bias voltage which is supplied between the emitter and base electrodes is in the forward or relatively conducting direction and the bias voltage which is applied between the collector and base electrodes is in the reverse or non-conducting direction. Thus, for a P-N-P transistor, that is, one of N type conductivity, the collector is normally biased negative with respect to the base, and the emitter is normally biased positive with respect to the base. On the other hand, for an N-P-N transistor, that is one of the P type conductivity, the collector is normally biased positive with respect to the base, while the emitter is normally biased negative with respect to the base. The biasing voltage for the several transistors employed in the circuit of Figure 1 are seen to be of these "normal" polarities.

Gating signals 74, 76 and 78 may be applied to the several input terminals 68, 70 and 72, respectively, to provide the gating action. The gating signals are negative-going at the base electrodes with respective to that at the positive terminal of battery 32. The quiescent level of each of the auxiliary transistor base electrodes 56, 58 and 60 is the same as that of the positive terminal of the battery 32. The sources of the gating signals may supply a suitable bias to provide this level, or resistors or inductors may be connected between the respective terminals 68, 70, 72 across which these gating signals may be developed. Leakage current (for example, between the emitter 50 and the collector 44 of the first auxiliary transistor 38 flowing through the resistor 62) maintains the emitter-base diodes, such as 50—56, slightly reverse biased. Therefore, relatively negligible collector current flows. Little or no current under these conditions flows through the summing resistor 49. The voltage of the second battery 51 is applied to the emitter-base diode 12—26 of the gating transistor 10 since the emitter 12 is coupled directly through the transformer secondary 14 to ground 18. The emitter-base diode 12—26 is maintained reverse biased and the gating transistor 10 non-conducting.

Upon the application of all of the negative gating signals 74, 76, 78 to the auxiliary transistors 38, 40, 42, the emitter-base diodes 50—56, 52—58, and 54—60 thereof become forward biased and the auxiliary transistors 38, 40, 42 go into a state of relative conduction. In this state of relative conduction, currents flowing into the emitters 50, 52, 54 create voltage drops across the respective limiting resistors 62, 64, 66. The resistance value of the limiting resistors is selected so that, with a known amplitude gating signal such as 74, the amount of emitter current flow in each of the transistors 38, 40, or 42 is limited to a known value. Due to the fact that emitter characteristics of transistors of a given type vary by a small amount, this emitter current may be maintained relatively constant without critically selecting the individual transistors to be employed in the circuit. In other words, the transistors of the circuit may be readily replaced with those of a like type.

Some of the characteristics of a transistor are described in an article entitled, "Large Signal Behavior of Junction Transistors" by J. J. Ebers and J. L. Moll, appearing in volume 42, page 1761, of the "Proceedings of the I.R.E." In this article it is stated that junction transistors (as well as point contact transistors) when used as a switch have essentially three regions of operation. Of these three regions, region 3 is defined as that condition of conduction existing when the emitter-base, as well as the collector-base junction is forward biased. Operation in region 3 is often referred to as transistor saturation. If a transistor is allowed to operate in saturation, a condition known as storage exists, as is described in the Ebers and Moll article, which lasts a definite time. In other words, even though the emitter-base diode of a transistor be reverse biased, a finite time after application of the reverse bias is required to effectuate cutoff. This storage effect, therefore, may cause a limitation on the maximum repetition frequencies at which the transistors may be successively cut off or made to conduct. The limiting resistors 62, 64, 66 tend to prevent the transistors 56, 58, 60, respectively, from operating in saturation. Such a limitation is thus avoided, and the recovery time of the circuit is shorter than what otherwise would be.

Conduction in any one auxiliary transistor 38, 40 or 42 results in collector current flowing from the corresponding auxiliary transistor collector electrode 44, 46, or 48 through the summing resistor 49, thereby raising the voltage on the base 26 of the gating transistor 10. For example, suppose a situation in which the negative-going signal is applied to the terminals 68 only. The design of the circuit is such that the collector current flow from any single one of the auxiliary transistors 38, 40, 42 receiving an input signal provides an amount of current sufficient to increase the voltage on the base 26 between one-third and one-half of that necessary to place a forward bias between the emitter-base diode 12—26 of the gating transistor 10. In this situation, the change in bias voltage at the base 26 of the gating transistor 10 is insufficient to allow conduction in the gating transistor 10. A similar situation arises if negative input signals 74 and 76 are simultaneously available to the auxiliary transistors 38—40, respectively. Here, the constant collector currents are summed through the summing resistor 49. The resultant voltage applied to the gating transistor base electrode 26 is between two-thirds and unity of the gating voltage necessary to forward bias the gating transistor emitter-base diode 12—26.

If negative gating signals 74, 76 and 78 are simultaneously applied at the input terminals 68, 70 and 72, respectively, to each of the auxiliary transistors 38, 40 and 42, respectively, the full current through the summing resistor 49 is sufficient to supply a forward bias voltage across the gating transistor emitter-base diode 12—26. Forward bias in the gating transistor emitter-base diode 12—26 creates a collector current flow through the gating transistor collector 28 and a resulting negative output signal (negative at the ungrounded with respect to the grounded terminal) is available at the output terminals 36. The circuit of Figure 1 is thereby seen to perform a switching function. If, simultaneously with the application of the three auxiliary transistor input pulses 74, 76 and 78, respectively, an input signal 24 is applied at the input terminals 22 of the transformer 16, such input signal 24 is amplified by the gating transistor 10 and appears at the output terminals 36 in amplified form. In this latter instance, the circuit of Figure 1 functions as a transmission gate.

Thus, the circuit provides a current summation type gating. An output signal is provided upon the simultaneous application of input signals to each of the three auxiliary transistors 38, 40 and 42. Due to the current limiting resistors 62, 64 and 66, respectively, each of the auxiliary transistors provides substantially the same output current which is substantially independent of the particular transistor of a given type employed. High pulse repetition frequencies may be employed, since the auxiliary transistors do not operate in saturation. Further, the circuit may operate either as a switching gate or a transmission gate. An input signal applied to the gating transistor 10 is transmitted in an amplified form to the output terminals 36. The number of auxiliary transistors employed is not limited to three, as illustrated in Figure 1, but one or more may be coupled to the current summing resistor 49, as desired. In each of these cases, either the amplitudes of the gating signals such as 74, 76 and 78, or the values of the limiting resistors 62, 64 and 66, or both, are suitably altered. The normal leakage current of the auxiliary transistors may be so small that a surprisingly large number of auxiliary transistors may be employed.

The circuit values for the circuit of Figure 1 may vary according to the design for a particular application. The following values corresponding to one successful circuit are included, however, by way of example: The source 32 has a value of 7 volts, the source 51 has a value of 10 volts, current limiting resistors 62, 64 and 66 each have a value of 9100 ohms, the value of the current summing resistor 49 has a value of 5,000 ohms, the load resistor 30 has a value of 5,000 ohms, the capacitor 34 has a capacity of .01 microfarad.

With these circuit values, input gating pulses to the input terminals 68, 70 and 72, respectively, are desirably in the order of —6 volts, and the information pulses to be transmitted at input terminals 22 are desirably in the order of 3 volts.

The P-N-P transistors employed were type 2N4140 and the N-P-N transistor 10 was type 2N94A.

If the polarity of each of the supply sources 32 and 51 and the type conductivity of each of the transistors is reversed, the circuit exhibits similar circuit characteristics to those of the circuit just described. The polarity of the input gating signals and of the output are then also reversed.

Referring now to Figure 2, the circuit illustrated is substantially the same as that of Figure 1, except that in place of the transistor 10 (Fig. 1) a gating transitsor 90 having opposite conductivity (P-N-P) to the transistor 10 (Fig. 1) is employed. Also, appropriate changes are made in the biasing voltages, as will appear from the example below. The P-N-P gating transistor 90 includes an emitter electrode 92, which is coupled through the secondary winding 14 of the transformer 16 to the negative terminal of the battery 51. The P-N-P gating transistor 90 also includes a base electrode 102, which is coupled to the current summing resistor 49 and the collectors 44, 46 and 48 of the respective auxiliary transistors 38, 40 and 42. The gating transistor 90 also includes a collector electrode 104, which, as in Figure 1 is coupled to the output capacitor 34 and the load resistor 30. In the case of Figure 2, the load resistor 30 is serially connected between the collector 104 and the negative terminal of a direct current source which is illustrated as a battery 106. The positive terminal of the battery 106 is coupled to the ground 18. A current source, illustrated as a battery 108, is connected between ground 18 and the limiting resistors 62, 64 and 66. The battery 32 of Figure 1 is omitted in Figure 2.

The remaining circuit elements of Figure 2 are the same as those of Figure 1 and, accordingly, bear the same reference numerals. Input pulses to the gating transistor input terminals 22 are of a positive polarity at the marked transformer terminal, as indicated by the pulse 110.

The battery 106 may have a potential of 17 volts, and the battery 108 may have a potential of 7 volts. Other values of the circuit of Figure 2 may be the same as those already given for the circuit of Figure 1.

In the presence of an information pulse 110 to be gated and in the absence of input signals 74, 76 and 78 at any of the auxiliary transistor input terminals 68, 70 or 72, the emitter-base diode 92—102 of the gating transistor 90 is forward biased. Collector current flows from the collector 104 of the gating transistor resulting in the passage of the input signal 110. With the presence, however, of one or more additional pulses 74, 76 or 78 at any of the auxiliary transistors input 68, 70 or 72, the passage of the simultaneously applied input pulses 110 is blocked. Hence the circuit functions as an inhibitory gate.

The presence of a negative input inhibiting signal at any one of the auxiliary transistor base electrodes, for example, 74 produces a forward bias between the corresponding base and emitter electrodes 56—50 of the corresponding auxiliary transistor 38. Collector current flows from the collector 44 through the resistor 49. The resulting IR drop across the resistor 49 reverse biases the emitter-base diode 92—102 of the gating transistor 90. The effect of the gating signal 110 is negated and no output results.

A similar result occurs if inhibit signals are present at any one or all of the remaining inputs 70, 72 of the auxiliary transistors. Similar advantages to those set forth with respect to Figure 1 are also available in Figure 2. Thus, any of the auxiliary transistors 38, 40 or 42 may readily be replaced or initially selected without excessive regard to the transistor characteristics. Further, substantially constant collector current is available from each of the auxiliary transistors. The limiting resistors 62, 64 and 66 tend to prevent saturation of the transistors 38, 40 and 42. The circuit of Figure 2 may operate with relatively high pulse repetition frequencies because the storage effects of the auxiliary transistors need not be overcome.

It should be noted in connection with both Figures 1 and 2, that the inputs at the input terminals 68, 70 and 72, respectively, may be provided through suitable transformers. Also, by changing the circuit of Figure 2 to use transistors of conductivity type opposite to those illustrated and correspondingly changing the polarities of the input signals and current sources, a similar inhibitory gating circuit is derived which operates with inputs and output polarity opposite to those of Figure 2.

There has thus been described a simple transistor gating circuit that does not require critical selection of the individual transistors employed and which may be operated with relatively high pulse repetition frequencies.

What is claimed is:

1. A transistor switching circuit comprising, in combination, a first, a second, and a third transistor, said first transistor having a base, an emitter to which a signal to be translated is applied, and a collector from which said signal to be translated is withdrawn, said second and said third transistors each having a collector and an emitter, a first resistor and a second resistor, respectively, coupled between said second and said third transistor emitters and a point of reference potential, respectively, first circuit means connected with said second transistor for receiving a first input signal for rendering said second transistor conductive, second circuit means connected with said third transistor for receiving a second input signal for rendering said third transistor conductive, and a third resistor having two terminals, one connected to said first transistor base, said second transistor collector and, said third transistor collector, and the other connected to a terminal to which an operating voltage for said second and third transistors and a bias voltage for said first transistor may be applied.

2. A transistor switching circuit comprising, in combination, a first, a second, and a third transistor, said first transistor being of an opposite conductivity type to said second and said third transistors, said first transistor having a base and a collector, said second and said third transistors each having a collector and an emitter, a first resistor and a second resistor, respectively, connected between said second and said third transistor emitters and a point of reference potential, respectively, first means connected with said second transistor for receiving a first switching signal, second means connected with said third transistor for receiving a second switching signal, a current summing resistor having two terminals, one of which is connected to said first transistor base, said second transistor collector, and said third transistor collector, output circuit means connected between said first transistor collector and each of said second and said third transistor emitters for providing an output signal upon the simultaneous occurrence of said first and said second input signals, and means for connecting a common energizing source for said second and third transistors between the other terminal of said resistor and said second and third transistor emitters whereby said resistor is a common current summing resistor for said second and third transistor collectors.

3. A transistor switching circuit comprising, in combination, a first a second, and a third transistor, said first transistor being of an opposite conductivity type to said second and said third transistors, said first transistor having a base and a collector, said second and said third transistors each having a collector, an emitter, and a base, first means coupled with said second transistor base for receiving a first switching signal, second means connected with said third transistor base for receiving a second switching signal, a first resistor and a second resistor, respectively, coupled between said second and said third transistor emitters and a point of reference potential, respectively, a two terminal current summing resistor connected at one terminal to said first transistor base, said second transistor collector, and said third transistor collector, and at the other terminal to a connection to which an operating voltage for the second and third transistors may be applied, and circuit means associated with said first transistor collector and each of said second and said third transistor emitters for providing an output signal upon the simultaneous occurrence of said first and said second input signals.

4. A signal translating circuit for translating an input signal responsive to the simultaneous occurrence of a first and a second gating signal comprising, in combination, a first, a second, and a third transistor, said first transistor being of an opposite conductivity type to said second and said third transistors, said first transistor having a base and an emitter, means coupled with said first transistor emitter for receiving said signal to be translated, said second and said third transistors each having a collector, an emitter, and a base, first means coupled with said second transistor base for receiving said first gating signal, second means connected with said third transistor base for receiving said second gating signal, a first resistor and a second resistor, respectively, coupled between said second and said third transistor emitters and a point of reference potential, respectively, and a two terminal current summing resistor connected at one terminal to said first transistor base, said second transistor collector, and said third transistor collector, and at the other terminal to a connection to which an operating voltage for said second and third transistors may be applied, whereby said first transistor translates said input signal upon the simultaneous occurrence of said first and said second gating signals.

5. A signal switching circuit comprising, in combination, an N-P-N type conductivity switching transistor having an emitter, a base, and a collector, means connected to said switching transistor emitter for receiving a signal to be switched, circuit means coupled to said switching transistor collector for providing an output representative of said signal to be switched, a first, a second, and a third P-N-P type conductivity transistor, each said first, said second, and said third transistors having an emitter, a base, and a collector, first, second, and third means, respectively coupled to said first, said second, and said third transistor bases, respectively, for receiving first, second, and third switching signals, respectively, each of said first, second, and third transistors having a separate resistor serially connected between its emitter and a point of reference potential, each of said first, second, and third transistor collectors being coupled to said switching transistor base, and a current summing resistor having one end coupled to said switching transistor base and the other end to the connection to which an operating voltage for said first, second and third transistors may be applied.

6. An inhibitory gating circuit for translating an input signal in the absence of first and second inhibit input signals comprising, in combination, a gating transistor of one conductivity type having an emitter, a collector and a base, circuit means coupled to said gating transistor emitter for receiving said input signal to be translated, first and second inhibitory transistors of the same conductivity type as said gating transistor each having a collector and an emitter, a first and a second impedance means, one connected between each inhibitory transistor emitter, and a point of reference potential, respectively, a third, summing impedance means connected at one end to said gating transistor base and to both said first and said second inhibitory transistor collectors, and at the other end to a terminal to which an operating voltage for said inhibitory transistors may be applied and first and second means, respectively, coupled with said first and second inhibitory transistors, respectively, for receiving said first and said second inhibit input signals, respectively.

7. An inhibitory gating circuit for translating an input signal in the absence of first and second inhibit input signals comprising, in combination, a gating transistor of one conductivity type having an emitter, a collector and a base, circuit means coupled to said gating transistor emitter for receiving said input signal to be translated, first and second inhibitory transistors of the same conductivity type as said gating transistor each having a collector and an emitter, a first and a second resistor, respectively, coupled serially with an individual one of said first and said second inhibitory transistor emitters, respectively, a two terminal third, summing resistor connected at one terminal to said gating transistor base and to both said first and said second inhibitory transistor collectors, and at the other terminal to a connection to which an operating voltage for the inhibitory transistors may be applied and first and second means, respectively, coupled with said first and said second inhibitory transistors, respectively, for receiving said first and said second inhibit input signals, respectively.

8. An inhibitory gating circuit for translating an input signal in the absence of first and second inhibit input signals comprising, in combination, a P-N-P type conductivity gating transistor having an emitter, a base, and a collector, circuit means coupled to said gating transistor emitter for receiving said input signal to be translated, output circuit means coupled to said gating transistor collector, first and second P-N-P type conductivity inhibitory transistors each having a collector, an emitter, and a base, a first and a second resistor, respectively, coupled serially with said first and said second inhibitory transistor emitters, respectively, a third resistor having one end coupled to said gating transistor base and to both said first and said second inhibitory transistor collectors, and the other end coupled to a connection to which an operating voltage for the inhibitory transistors may be applied and first and second means, respectively coupled with said first and said second inhibitory transistor bases, respectively, for receiving said first and said second inhibit input signals, respectively, whereby said input signal to be translated is translated to said output circuit means in the absence of said first and said second inhibit input signals.

9. In combination, first and second normally cut-off transistors, each having a base, emitter and collector; a direct connection between the base of said first transistor and the collector of said second transistor; a source of direct voltage; a load connected between said source and said connection, said source applying an operating voltage to said second transistor and a bias voltage to said first transistor, both through said load; means in circuit with said second transistor for limiting current flow therethrough to a value less than that producing saturation; means for applying a forward bias pulse to the base of said second transistor; and means for concurrently applying a current pulse to the emitter of said first transistor in a polarity to enable current flow in the emitter-to-collector path of the first transistor.

10. In the combination as set forth in claim 9, said first and second transistors being of opposite conductivity types whereby said source normally reverse-biases the base of said first transistor.

11. In the combination as set forth in claim 9, said first and second transistors being of the same conductivity type, whereby said source normally forward-biases the base of said first transistor.

12. In combination, first and second normally cut-off transistors, each having a base, emitter and collector; a direct connection between the base of said first transistor and an electrode other than the base of said second transistor; a source of direct voltage; a load connected between said source and said connection, said source applying an operating voltage to said second transistor and a bias voltage to said first transistor, both through said load; a resistor in series with the emitter of said second transistor; means for applying a forward bias pulse to the base of said second transistor; and means for concurrently applying a current pulse to the emitter path of said first transistor in a polarity to enable current flow in the emitter-to-collector path of the first transistor.

13. A transistor switching circuit for producing an output pulse in response to input pulses comprising, in combination, first, second and third transistors, each having a base, emitter and collector electrode; means for applying concurrent input pulses to each of said transistors in a sense to produce current flow through said transistors; a resistor having two terminals, one connected to the base electrode of the first transistor and the collector electrodes of the second and third transistors, and the other connected to a source of operating voltage for said second and third transistors; and means in series with the emitter electrodes of said second and third transistors for limiting current flow therethrough to a value less than that producing saturation.

References Cited in the file of this patent

UNITED STATES PATENTS

| | | |
|---|---|---|
| 2,557,729 | Eckert | June 19, 1951 |
| 2,666,139 | Endres | Jan. 12, 1954 |
| 2,823,856 | Booth et al. | Feb. 18, 1958 |
| 2,829,281 | Overbeek | Apr. 1, 1958 |
| 2,853,632 | Gray | Sept. 23, 1958 |
| 2,887,542 | Blair et al. | May 19, 1959 |

FOREIGN PATENTS

| | | |
|---|---|---|
| 1,081,207 | France | June 9, 1954 |

OTHER REFERENCES

Article entitled "Transistors as Switching Devices," by R. C. N. Mundy, Automatic Telephone and Electric Journal, July 1956, vol. 12, No. 3, pp. 173–181.

Lohman: "Complementary Symmetry," Electronics, September 1953, pp. 140–143.

"Junction Transistor Circuits for High-Speed Digital Computer Applications," by G. J. Pro and R. L. Crosby, Sylvania Electric Products, Inc., February 1956 (Fig. 3, page 8).

"The Transistor," by Bell Telephone Laboratories, Inc., December 4, 1951 (Fig. 5, page 452).

"Directly Coupled Transistor Circuits," by Beter, Bradley Brown, and Rubinoff, Electronics, June 1955 (Fig. 5A, p. 135).